United States Patent [19]
Voles

[11] Patent Number: 4,982,093
[45] Date of Patent: Jan. 1, 1991

[54] THERMAL IMAGING DEVICE

[75] Inventor: Roger Voles, London, England

[73] Assignee: Thorn EMI Electronics Limited, Hayes, England

[21] Appl. No.: 463,227

[22] Filed: Jan. 11, 1990

[30] Foreign Application Priority Data

Jan. 12, 1989 [GB] United Kingdom ................. 8900688

[51] Int. Cl.$^5$ .............................................. G01J 5/22
[52] U.S. Cl. .................................. 250/332; 250/338.3; 250/352
[58] Field of Search ........................ 250/338.3, 352, 332

[56] References Cited

U.S. PATENT DOCUMENTS

| | | | |
|---|---|---|---|
| 4,143,269 | 3/1979 | McCormack et al. | 250/352 |
| 4,663,529 | 5/1987 | Jenner et al. | 250/338.2 |
| 4,815,199 | 3/1989 | Jenner et al. | 29/840 |

FOREIGN PATENT DOCUMENTS 57-113331 7/1982 Japan ................................ 250/338.3

Primary Examiner—Constantine Hannaher
Attorney, Agent, or Firm—Fleit, Jacobson, Cohn, Price, Holman & Stern

[57] ABSTRACT

A thermal imaging device comprises a layer 11 of pyroelectric material, an array of interconnected electrodes 13, and an array of discrete electrodes 15 supported from a substrate 27 by pillars 23 of thermally insulating material. Heaters 17 and associated control electrodes 19 are also provided to reduce the temperature difference between the discrete electrodes 15 and the pillars 23 and substrate 27. Control circuits 25 are provided to control energisation of the heaters 17.

In a preferred embodiment the heaters may be provided on the substrate 27 for heating the discrete electrodes 13, the control current to the heaters providing an indication of the temperature of the source of radiation.

20 Claims, 2 Drawing Sheets

THERMAL IMAGING DEVICE

This invention relates to thermal imaging devices and in particular to thermal imaging devices comprising a pyroelectric array of detector elements responsive to infra-red radiation.

The main factor limiting the performance of such thermal imaging devices is the thermal conductance between adjacent detector elements and between each detector element and the supporting and interrogating structure.

GB Pat. application No. 2163596A describes a thermal imaging device having an array of detector elements coupled to electrodes of an interrogating structure by conductors in the form of plated bores in support pillars of a thermally insulating material. The thermally insulating material surrounds the conductors, thereby reducing the transverse heat conduction between adjacent conductors of the array. However, some heat conduction between conductors continues to occur and there is no reduction in the thermal conductance between the adjacent detector elements and between the detector elements and the supporting and interrogating structure.

It is an object of the present invention to provide an improved thermal imaging device wherein the above problems are substantially alleviated.

According to the present invention a thermal imaging device comprises: a layer of pyroelectric material; an array of interconnected electrodes carried on one major surface of the layer; an array of discrete electrodes carried on the other major surface of the layer so as to define with the interconnected electrodes an array of pyroelectric detector elements; the device being characterised in that discrete electrodes are provided with heater means effective for reducing the temperature difference between discrete electrodes and at least part of the supporting structure for the detector elements.

In one particular thermal imaging device in accordance with the invention, the device includes a moving shutter effective to periodically intercept incident infra-red radiation falling on the detector elements, the device including control means effective to cause the heater means to operate only in the periods when the radiation is not being intercepted by the shutter.

In another particular thermal imaging device in accordance with the invention, the device includes means for giving an output indicative of the current required to heat each discrete electrode to the temperature of said part of the supporting structure thereby to give an indication of the temperature of a distant object.

Three thermal imaging devices in accordance with the invention will now be described, by way of example only, with reference to the accompanying drawings in which.

Figure 1:
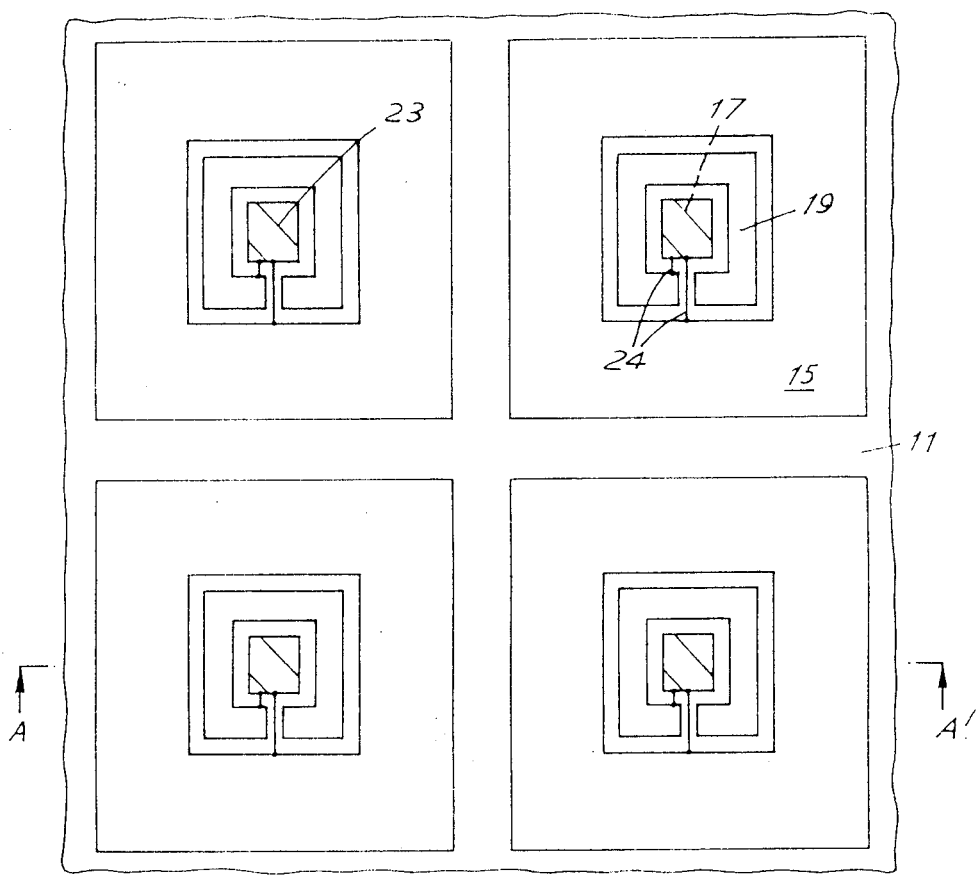
FIG. 1 is a view of the structure carried on part of a pyroelectric film forming part of the first device, the view corresponding to a section through the device along the line B—B in FIG. 2.
Figure 2:
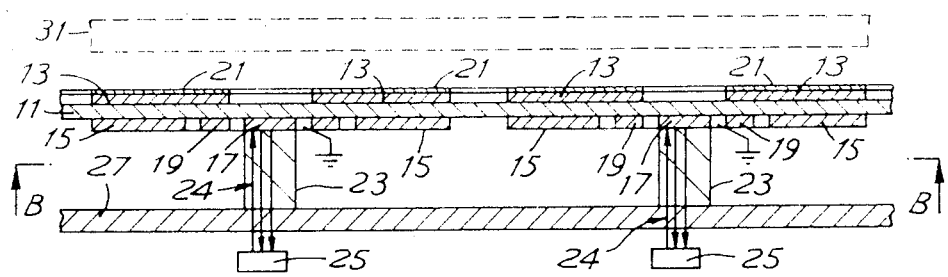
FIG. 2 is a schematic section through the device along the line A—A of FIG. 1.

Referring firstly to FIGS. 1 and 2 a pyroelectric film 11 carries an array of inter-connected electrodes 13 on one surface and an array of discrete electrodes 15 on the other surface. The inter-connected electrodes 13 have the same general shape as that of the discrete electrodes 15, and have corresponding positions on the pyroelectric film 11. The interconnected electrodes 13, film 11 and discrete electrodes 15 thus together define an array of pyroelectric detector elements. In order to improve the efficiency of the device the inter-connected electrodes are, preferably, covered by an infra-red absorbent layer 21.

Each discrete electrode 15 has a central non electrode area in which lies a respective resistive heater 17, surrounded by a respective annular feedback electrode 19, the inter-connected electrodes 13 extending over the areas of the pyroelectric film 11 corresponding to the positions of the feedback electrodes 19. Electrically and thermally insulative pillars 23 support the film 11 at each of the resistive heaters 17, the pillars in turn being supported by a substrate 27 which also functions as a heat sink for the device. Each pillar 23 carries electrical connections indicated generally as 24 from the corresponding heater and from the adjacent discrete electrode 15 and feedback electrode 19 to a control circuit 25, and also from the discrete electrode 15 to a signal processing circuit. A shutter, such as a rotating chopper, indicated schematically as 31, is positioned in front of the interconnected electrodes so as to periodically intercept infra-red radiation from an object (not shown) falling on the device. A suitable optical system (not shown) is arranged such that the chopper 31 intercepts infra-red radiation over the whole of the array of pyroelectric detector elements simultaneously. Thus the chopper 31 and optical system together define "closed" periods when incident infra-red radiation is cut off by the chopper 31, and "open" periods when the elements of the array are capable of receiving infra-red radiation from the object being imaged.

Figure 3:
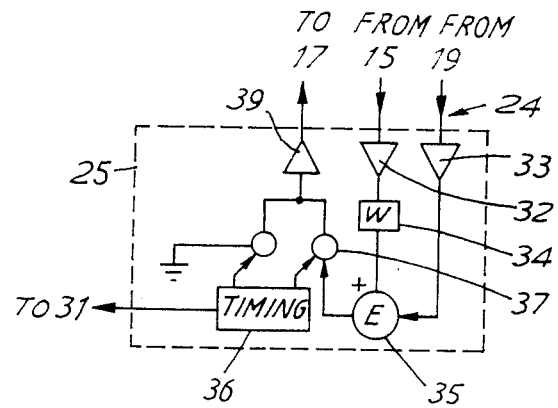
FIG. 3 illustrates schematically a control circuit used in the first device.

Referring now also to FIG. 3 in the control circuit 25, the outputs from the discrete electrodes 15 and feedback electrodes 19 are connected to pre-amplifiers 32,33 respectively. The voltage output from preamplifier 32 is weighted as necessary by a signal weighting means 34. This may be necessary because of the relative proximity of the feedback electrode 19 to the pillars 23, such that the temperature of the discrete electrodes will generally fall less than that of the feedback electrodes during the "closed" periods where the distant object is hotter than the substrate 27.

The outputs of the pre-amplifier 33 and weighting means 34 are fed into a subtractor 35 to produce a voltage difference signal. A timing circuit 36 connected to the controls for the rotating chopper 31, indicates when infra-red radiation is being received by the pyroelectric elements i.e. the "open" periods, and when it is cut off by the rotating chopper i.e. the "closed" periods. When radiation is being received, the gate 37 is opened and the difference signal from the subtractor 35 is amplified by amplifier 39 to provide a voltage across the heater 17 as necessary so as to produce a voltage difference signal from the subtractor 35 which is nulled. Thus the temperature of each feedback electrode 19 is controlled such that it is equal or close to that of the surrounding discrete electrode 15. This then minimises the lateral flow of heat from each pyroelectric detector element during each "open" period, the top of each pillar 23 being at a temperature close to that of the adjacent detector element.

In some circumstances, noise at the outputs of the pre-amplifiers 32 and 33 may be a limitation in the implementation of the feedback loop. In such circumstances, some improvement may be obtained by increasing the frequency of the chopping cycle produced by the rotating chopper, for example by a factor of two, and then using the integrated difference signal from one "open" period when radiation is being received to determine the required heater voltage during the next "open" period.

Figure 4:
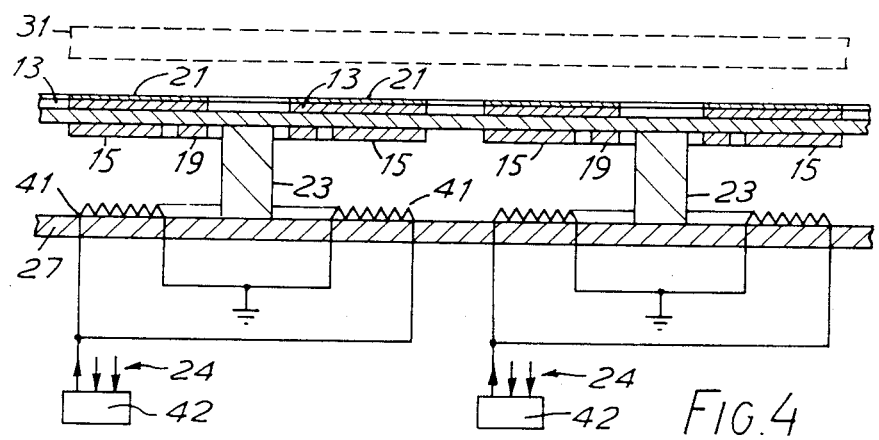
FIG. 4 shows a schematic sectional view through part of the second device.

The thermal imaging device shown in FIGS. 1 to 3 and described hereinbefore is suitable if the heat flow during the "open" periods is from the discrete electrodes 15 via the feedback electrodes 19 and the pillar 23 to the heat sink provided by the supporting substrate 27, that is if the radiation is from a source having a temperature Greater than that of the substrate 27. However, if the radiation is from a source having a temperature lower than that of the substrate 27, it is necessary to heat the discrete electrode 15 during the "open" periods. In the arrangement of FIG. 4 in which corresponding features to those of the first device are correspondingly labelled, resistive heaters 41 are located on the surface of the substrate 27 on which the pillars 23 stand, and are arranged to heat the corresponding discrete electrode 15. A control circuit 42, similar to the control circuit 25 shown in FIG. 3 can be used to ensure that the temperatures of each feedback electrode 19 and associated discrete electrode 15 are held equal. The heating voltage then provides a measure of the temperature at the source of radiation.

Figure 5:
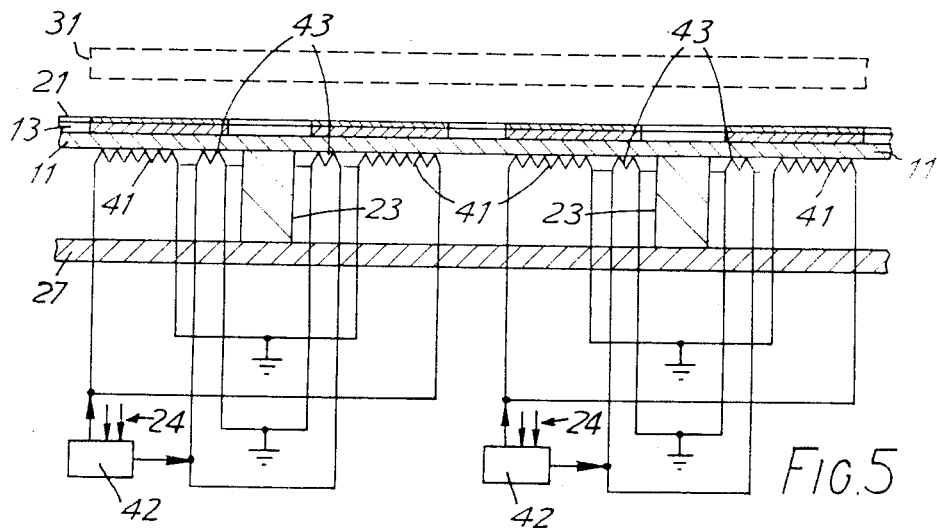
FIG. 5 shows a schematic sectional view through part of the third device.

A further alternative device is shown schematically in FIG. 5. In this device the heaters 41 are located on the surface of the pyroelectric film 11, the heaters taking the form of resistive films in the shape of the discrete electrodes 15, the leads to the heaters being normally carried by the pillars 23. Auxiliary heaters 43 are provided in respect of the feedback electrodes 19, the heaters again taking the form of resistive films in the shape of the feedback electrodes. This arrangement enables the device to be used whether the temperature of the source is either hotter or colder than that of the substrate 27. In such an arrangement, the voltage across each discrete electrode 15 will constitute the detected signal when the temperature of the discrete electrode is greater than that of the substrate 27. When the temperature of the discrete electrode is less than that of the substrate 27 however, the voltage across each discrete electrode 15 will be the voltage needed to heat the discrete electrode. The auxiliary heaters 43 will be used to heat the areas surrounding the discrete electrodes 15 to alleviate heat loss from the discrete electrodes 15 when the device receives radiation from a source having a temperature hotter than that of the substrate 27.

Clearly embodiments of the present invention are not restricted to the particular shapes of electrodes shown and described hereinbefore. Thus, the electrodes can be of a complex shape; in an advantageous form the shape of the electrodes conforms to the isothermal-resistance contours of the devices, such that the electrodes are located in regions wherein the thermal resistance to ground has a relatively high value.

It will be appreciated that the pyroelectric film and overlying infra-red absorbing layer may be formed from any suitable materials, for example polyvinylidene fluoride, in the case of the pyroelectric film, and gold-black, platinum black, and metal-dielectric-metal sandwich structures in the case of the infra-red absorbing layer.

It will also be appreciated that alternative heaters to the resistive heaters 19,41,43 described herebefore may be used in devices in accordance with the invention. Examples of such alternative heaters are laser diodes, which may be integrated into the substrate, which may be formed from silicon, or dielectric heating using the pyroelectric film itself. In order to prevent any possible electrical interference between the heater current and the electrical signals from the pyroelectric detector elements, it may be advantageous to use an AC current.

It will also be appreciated that whilst in each of the control circuits 25 or 42 described herebefore, voltage signals are derived which are used to give an indication of the voltage required to be applied across the heaters, alternative circuits may readily be devised which give an indication of the current required to be carried by the heaters.

We claim:

1. A thermal imaging device comprising a layer of pyroelectric material; an array of interconnected electrodes carried on one major surface of the layer; an array of discrete electrodes carried on the other major surface of the layer so as to define with the interconnected electrodes an array of pyroelectric detector elements; and a supporting structure for the detector elements, wherein the discrete electrodes are provided with respective heater means for reducing temperature difference between discrete electrodes and at least part of the supporting structure.

2. A device according to claim 1 wherein the heater means are arranged on the other major surface between the supporting structure and the layer of pyroelectric material.

3. A device according to claim 2 comprising feedback electrodes carried on the other major surface of the layer of pyroelectric material.

4. A device according to claim 2 wherein the supporting structure comprises support pillars of a thermally insulating material for supporting respective detector elements.

5. A device according to claim 1 wherein the supporting structure comprises a substrate layer and the heater means are arranged on a major surface of the substrate layer facing the other major surface of the layer of pyroelectric material for heating respective discrete electrodes.

6. A device according to claim 5 comprising feedback electrodes carried on the other major surface of the layer of pyroelectric material.

7. A device according to claim 1 comprising feedback electrodes carried on the other major surface of the layer of pyroelectric material.

8. A device according to claim 7 wherein the heater means are arranged on the other major surface of the layer of pyroelectric material and the device further comprises auxiliary heater means for heating respective feedback electrodes.

9. A device according to claim 8 wherein the supporting structure comprises support pillars of a thermally insulating material for supporting respective detector elements.

10. A device according to claim 9 wherein the feedback electrodes are of annular shape arranged about the support pillars.

11. A device according to claim 10 wherein the heater means have a shape corresponding substantially to that of the discrete electrodes and the auxiliary heater means have a shape corresponding substantially to that of the feedback electrodes.

12. A device according to claim 8 wherein the heater means have a shape corresponding substantially to that of the discrete electrodes and the auxiliary heater means have a shape corresponding substantially to that of the feedback electrodes.

13. A device according to claim 7 wherein the supporting structure comprises support pillars of a thermally insulating material for supporting respective detector elements.

14. A device according to claim 13 wherein the feedback electrodes are of annular shape arranged about the support pillars.

15. A device according to claim 1 wherein the supporting structure comprises support pillars of a thermally insulating material for supporting respective detector elements.

16. A device according to claim 1 wherein the heater means comprise resistive films, laser diodes or dielectric heaters, or any combination thereof.

17. A device according to claim 1 comprising shutter means for periodically intercepting infra-red radiation incident on the detector elements and a control circuit for energising the heater means only in periods when the incident radiation is not intercepted by the shutter means.

18. A device according to claim 17 wherein the control circuit is arranged to determine, in one period when the incident radiation is not intercepted by the shutter means, the required energisation of the heater means for the next period when the incident radiation is not intercepted by the shutter means.

19. A device according to claim 18 wherein the the control means is arranged to provide, from the energisation of the heater means to heat the respective discrete electrodes to a temperature substantially corresponding to the part of the supporting structure, an indication of the temperature of the source of the infra-red radiation.

20. A device according to claim 17 wherein the control means is arranged to provide, from the energisation of the heater means to heat the respective discrete electrodes to a temperature substantially corresponding to the part of the supporting structure, an indication of the temperature of the source of the infra-red radiation.

* * * * *